US005973394A

United States Patent [19]
Slocum et al.

[11] Patent Number: 5,973,394
[45] Date of Patent: Oct. 26, 1999

[54] SMALL CONTACTOR FOR TEST PROBES, CHIP PACKAGING AND THE LIKE

[75] Inventors: Alexander H. Slocum, Bow; R. Scott Ziegenhagen, II, Bedford; Robert A. Richard, New Boston, all of N.H.

[73] Assignee: Kinetrix, Inc., Bedford, N.H.

[21] Appl. No.: 09/012,838

[22] Filed: Jan. 23, 1998

[51] Int. Cl.⁶ .............................. H01L 23/48; H01L 23/52
[52] U.S. Cl. .................. 257/690; 257/738; 257/669; 439/82
[58] Field of Search .................... 257/690, 693, 257/673, 737, 738, 734, 735, 784, 692, 696, 669, 674; 439/55, 82, 84, 71; 324/758

[56] References Cited

U.S. PATENT DOCUMENTS

| | | | |
|---|---|---|---|
| 4,893,172 | 1/1990 | Matsumoto et al. | 257/738 |
| 5,047,740 | 9/1991 | Alman | 335/4 |
| 5,121,089 | 6/1992 | Larson | 333/107 |
| 5,313,157 | 5/1994 | Pasiecznik, Jr. | 324/158 P |
| 5,420,461 | 5/1995 | Mallik et al. | 257/734 |
| 5,602,422 | 2/1997 | Schueller et al. | 257/738 |
| 5,632,631 | 5/1997 | Fjelstad et al. | 439/82 |
| 5,763,941 | 6/1998 | Fjelstad | 257/669 |
| 5,810,609 | 9/1998 | Faraci et al. | 257/780 |
| 5,812,378 | 9/1998 | Fjelstad et al. | 361/769 |

FOREIGN PATENT DOCUMENTS

96/16440    5/1996    WIPO .

OTHER PUBLICATIONS

Doane, Daryl Ann & Franzon, Paul D. *Multichip Module Technologies and Alternatives: The Basics*, 1993, pp. 56–66.

Giga BGA. *Johnstech International*, Oct. 1996.

Giga Family. *Johnstech International*, May 1997.

Kim et al. Solder Joint Reliability of a New Leadless CSP. *Chip Scale Review*, Dec. 1997.

Kulesza, Frank W. & Estes, Richard H. A Better Bump: Polymers' Promise to Flip Chip Assembly, *Advanced Packaging*, Nov./Dec. 1997.

Leung et al. Active Substrate Membrane Probe Card, 1995.

Link, Joe & Solberg, Vern. Placement and Reflow of 0.3 mm Diameter Solder Balls for Chip–Scale uBGA *Devices Chip Scale Review*, Dec. 1997.

Yi et al. A Microwave Active Probe Device Compatible with SOI–CMOS Technologies. *Journal of Microelectromechanical Systems*, vol. 6, No.3 Sep. 1997.

*Primary Examiner*—Olik Chaudhuri
*Assistant Examiner*—Phat X. Cao
*Attorney, Agent, or Firm*—Edmund J. Walsh

[57] ABSTRACT

An electrical contact element that solves many problems associated with making electrical connections to integrated circuit chips. The contact element fits in small areas, but in some configurations can provide compliance in multiple directions to provide the required compliance. The contacts are shaped to provide relatively large stroke and also large force for good electrical contact. Contact elements according to the invention are incorporated into contactors for making electrical contact to Ball Grid Arrays for testing. Contact elements according to the invention are also incorporated into Ball Grid Array packages, and used as a mounting point for solder balls. The contact elements make the electrical connection withstand stress associated with differential thermal expansion.

15 Claims, 8 Drawing Sheets

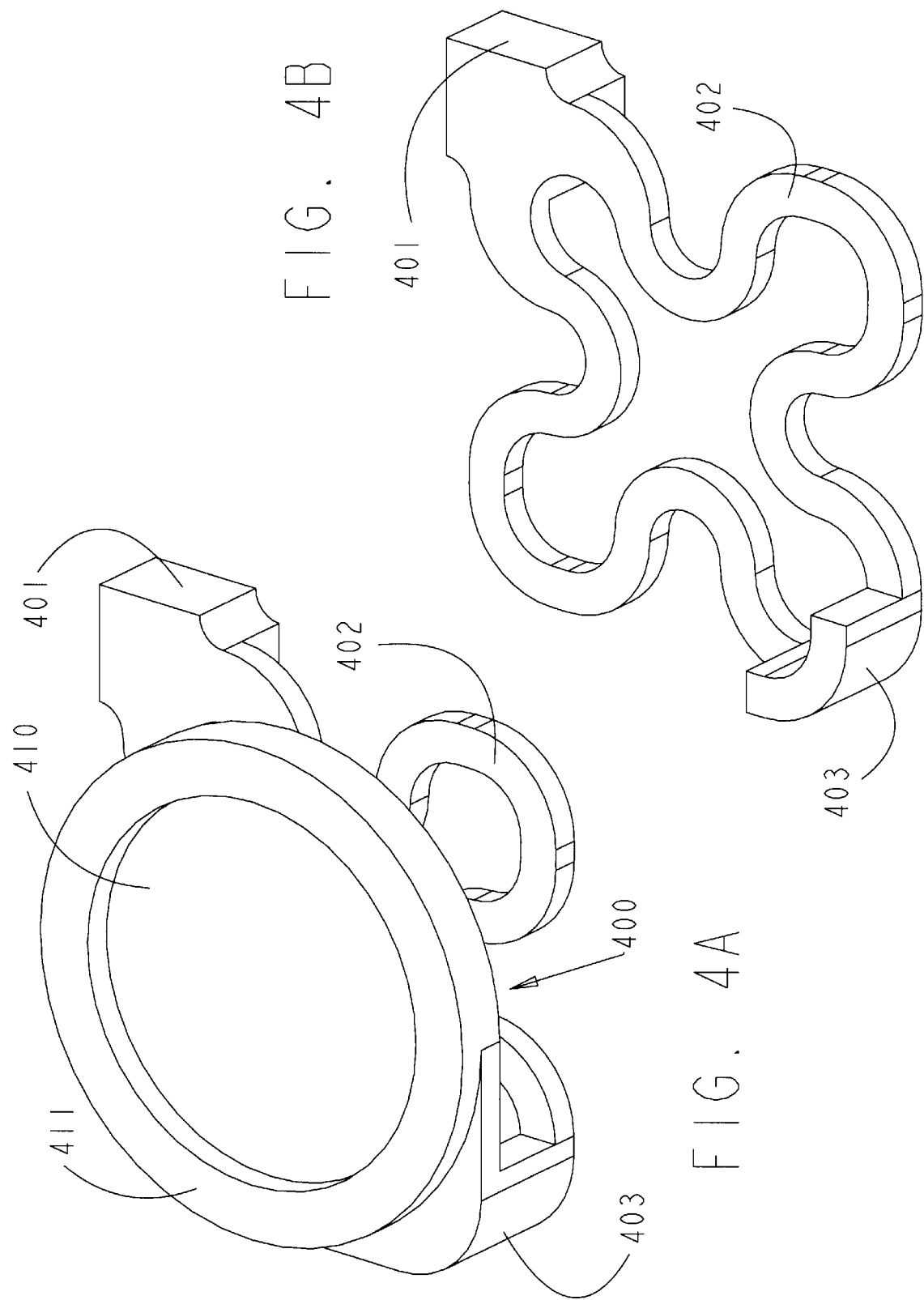

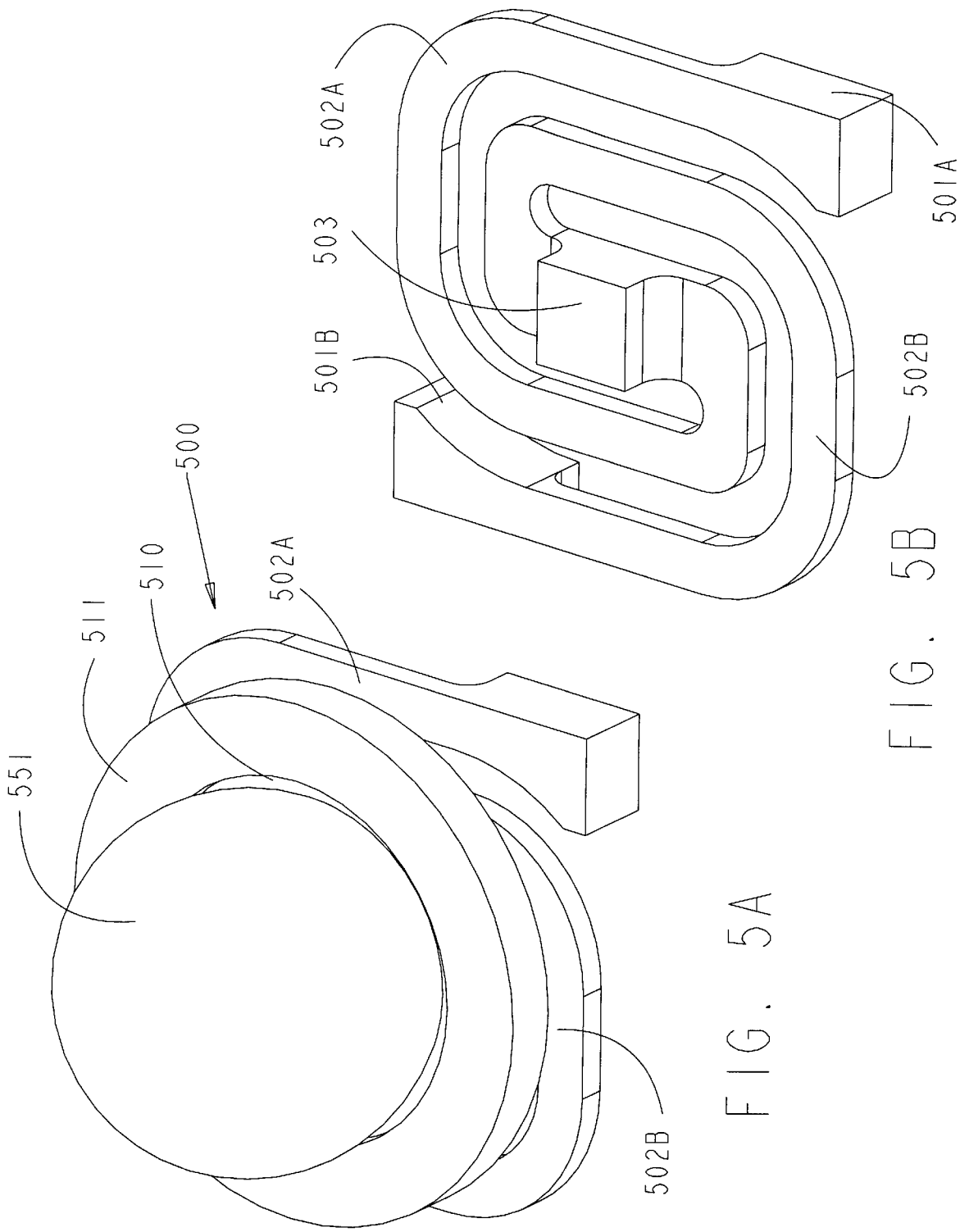

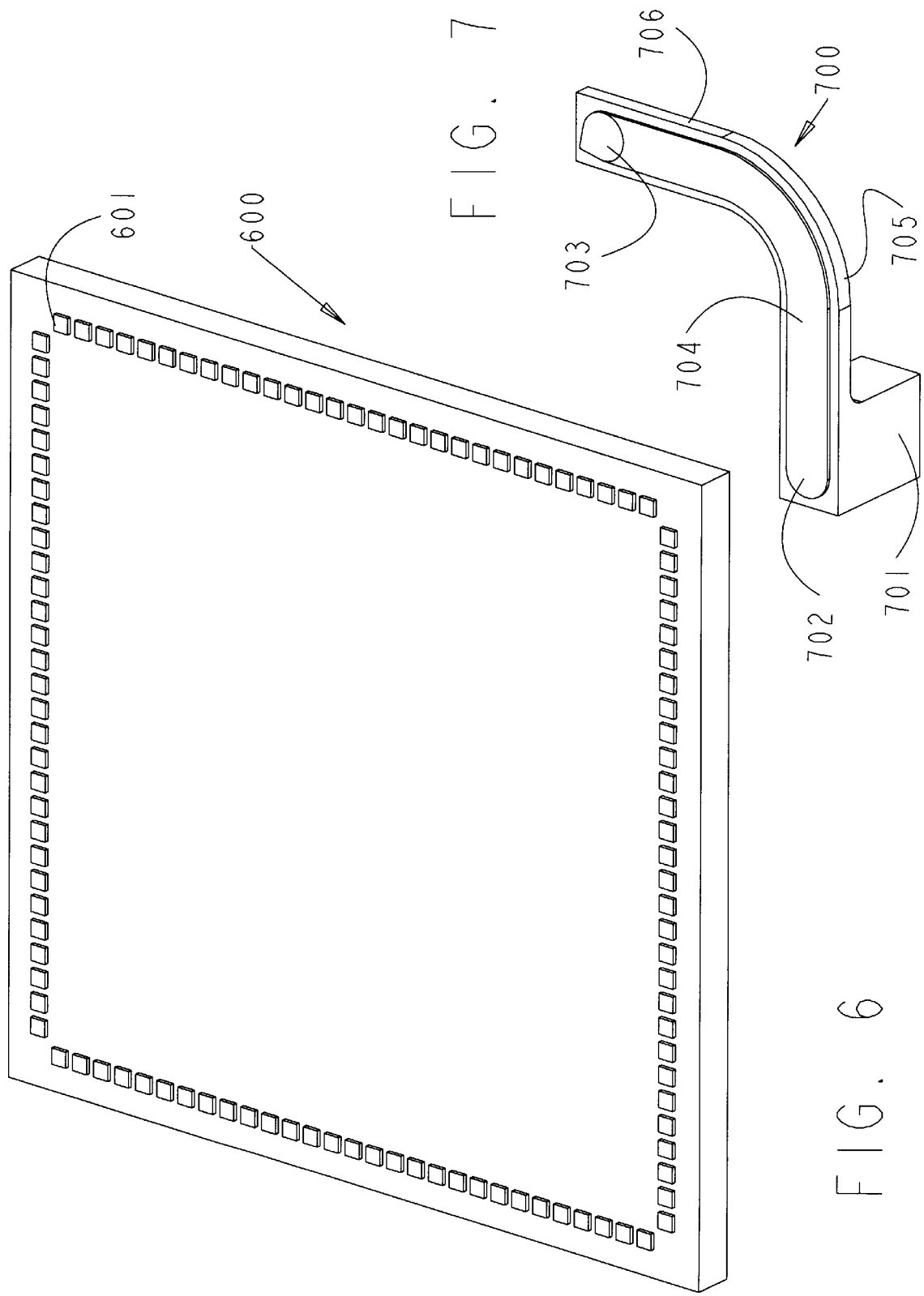

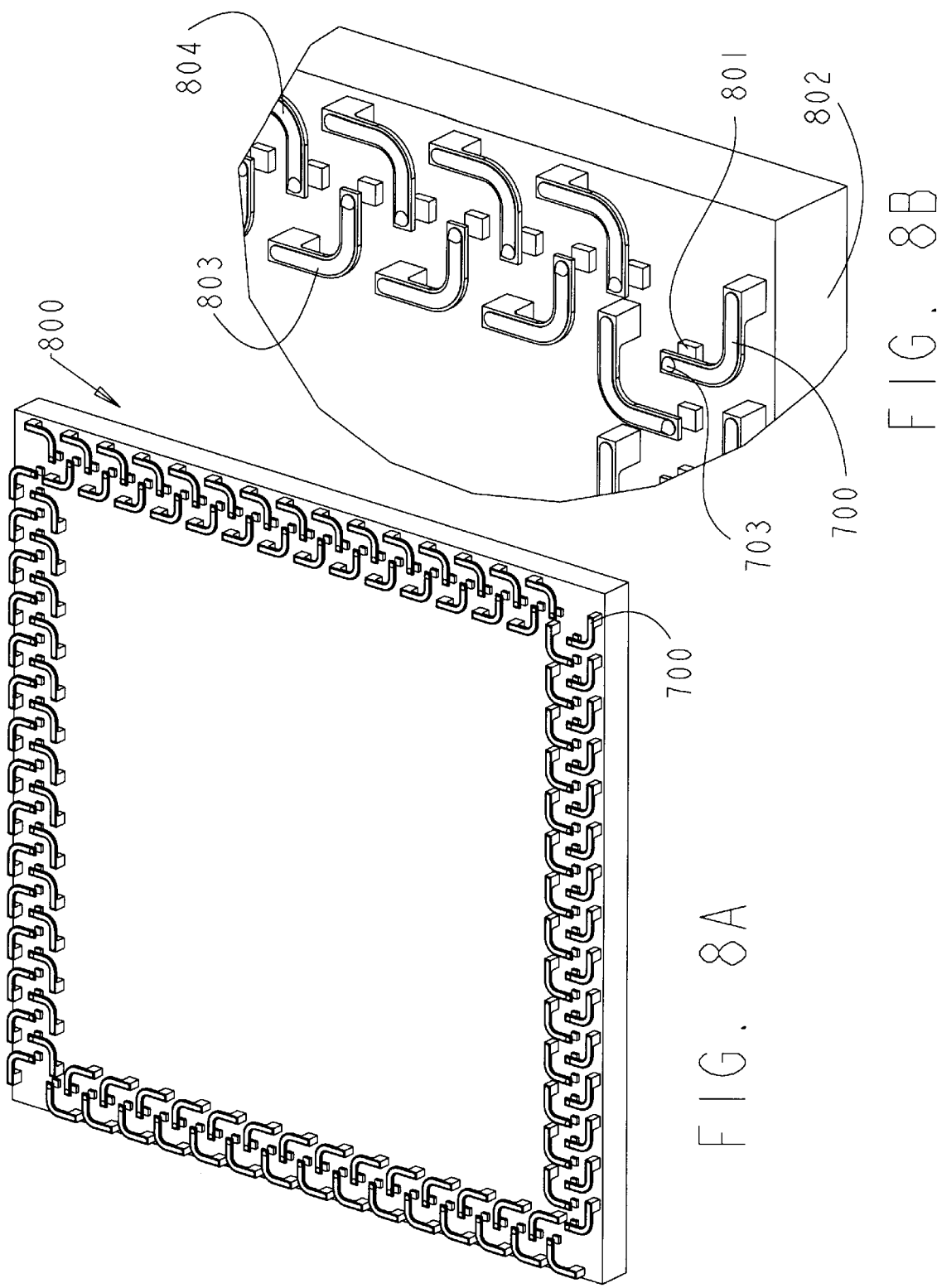

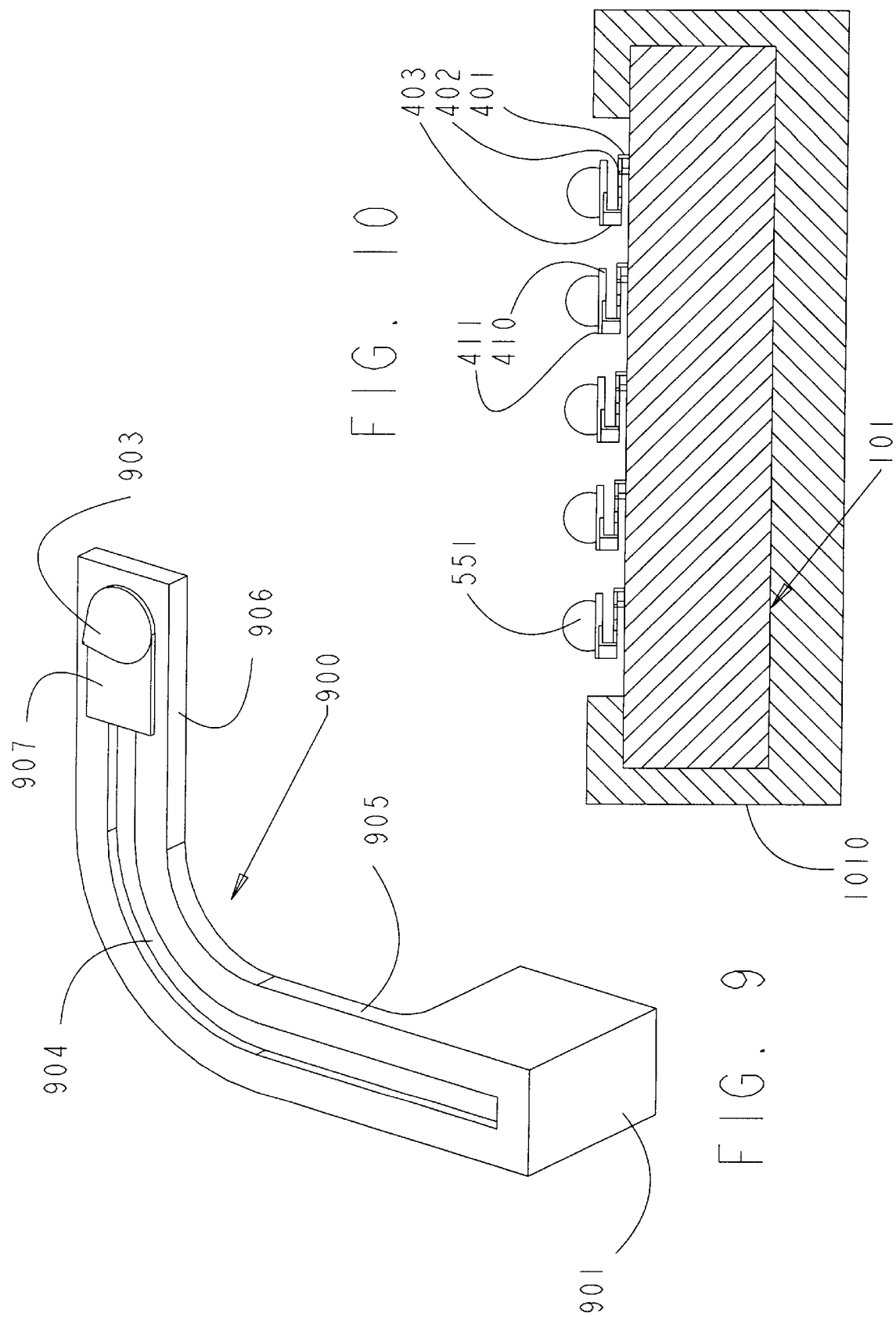

SMALL CONTACTOR FOR TEST PROBES, CHIP PACKAGING AND THE LIKE

This invention relates generally to semiconductor integrated circuits and more specifically to structures for making reliable electrical contact thereto.

The use of small scale packaging, such as Ball Grid Array technology, has created additional challenges in making electrical contact to integrated circuit chips. One problem is making contact to semiconductor chips for testing. Each chip has many test points that must be contacted. The test points are very close together, making it difficult to make good electrical contact to all of the test points at once. The problem exists whether the chip is tested as a packaged part or while still on a semiconductor wafer.

Making contact to a packaged semiconductor part for testing is generally accomplished by pressing the part into a contactor. A contactor is a socket with numerous springy contact elements. One end of each contact element is connected to an automatic test system. The other end of the contact element makes contact with a test point on the integrated circuit chip. For a ball grid array, each solder ball is generally used as a test point.

There is generally one contact element for each test point on the package of the integrated circuit chip. When the test points are very close together, it becomes difficult to provide contact elements that have the required amount of compliance and generate sufficient spring force to make good electrical connection. There are few commercially available contactors suitable for use with ball grid arrays, particularly ball grid arrays where the balls are on a very small pitch, such as 1.27 mm or smaller.

One commercially available contactor has S-shaped contact elements. The looped parts of the "S" engage an elastomeric material to form two springy elements. One side of the S is pressed against the test point and the other is pressed against a pad that is connected to the test system. Such a contactor is difficult and expensive to make. In addition, each time a part is pressed into the contactor, the S shaped contact element scrapes across the pad. This scraping action can cause excessive wear on the pad, limiting the useful life of the contactor. In addition, the ends of the S shaped contact elements act like coupled parallel plate capacitors, which limits electrical performance.

In general, a limiting factor in making contactors for small BGA devices is that the physical space available for the contact elements is very limited. The beams which form the springy portions of the contact elements must therefore be relatively short. Short beams are not as compliant as longer beams and the distance the beams can deflect when making electrical contact, or the "stroke" of the contact element, is therefore limited.

A problem with having a limited stroke is that it significantly increases the accuracy with which the test point on the chip must be positioned relative to the contactor for the contactor to work. This is referred to as the planarity of the contact points. When pressing the chip into the contactor, the test point on the chip should press down on the contact element so that the springy portion of the contact element is deflected enough to generate sufficient spring force to make good electrical contact. For example, the contactor might be designed so that the test point on the chip is intended to deflect the contact element by an amount equal to one half of its stroke. In this case, one half of the stroke is an upper limit on the amount of inaccuracy that is possible in positioning the test point. If the test point is too high by that amount, it will not make contact with the contactor at all.

Thus, the greater the stroke of the contact element, the more tolerance there is for inaccurate positioning of the test points on the chip during testing, i.e. lack of planarity of the contact points. Greater tolerance in positioning the test points will translate into a greater likelihood likely that good electrical contact will be made to the test points.

This problem is particularly severe for ball grid array type packages. A ball grid array package might have hundreds of test points. All test points in the array must be contacted simultaneously. Thus, not only must the BGA package be positioned accurately relative to the contact elements, the test points on the BGA package must be positioned accurately relative to the package. For a BGA, this is difficult because the test points are solder balls. The solder balls are generally formed and then placed on pads on the package. There is significant variability in the processes of forming the balls and attaching them to the pads. For example, thermal "warp" of the chip can lead to significant variability. As a result that there can be significant variation in the height of the solder balls. Given the small area to make contact elements for a BGA package, the variation in heights of solder balls is likely to exceed the tolerance because of limited stroke of the contact elements.

Thus, it would be highly desirable to have contact elements, which fit in a limited area, but still have good stroke.

A similar problem exists with making contact to the chips before they are packaged. Many integrated circuit chips are tested while they are still part of the wafer on which they are fabricated. The test points are pads on the surface of the integrated circuit chip. These test points are even smaller and closer together than the test points on the packaged part.

Contact is generally made to the chip for wafer level testing using a "probe card." Traditional probe cards use long tungsten needles for contact elements. Such probe cards are expensive to make and are also easily damaged. In addition, a wafer contains many chips. For economical processing, many chips are tested simultaneously. The probe card must therefore have contact elements which are aligned with the pads on each of several chips. However, there is not sufficient space to position long needles such that they align with pads on adjacent chips on the die. Therefore, when a probe card is set up to probe multiple chips simultaneously, the contact elements on the probe card are positioned to make contact with chips that are widely spaced on the wafer. This arrangement of contact elements reduces the efficiency of the testing process.

Some probe cards have recently been made by attaching small, S-shaped perpendicular to the surface of a ceramic substrate. Tips might be attached to the S-shaped wires with points for better electrical contact. However, such probe cards are complex and expensive to manufacture. They are also very delicate and easily damaged.

It would be highly desirable to have a probe card that is made with very short contact elements that can be aligned with contact pads on adjacent chips on the wafers. It would also be desirable to have such a probe card that is less expensive to manufacture and less susceptible to damage.

It has been suggested to make probe cards with micro-machined beams that miniaturize the geometry and mimic the tungsten needles. Micromachining involves processing techniques similar to those used to make semiconductor chips. Layers of material are deposited on a substrate. Masks are used to form protective coatings in particular patterns on the layers. When the layers are exposed to various etching solutions, structures are left that have the required shape. Micromaching has been used for making various structures, such as relays.

However, micromachined beams suffer from various drawbacks. One problem is that it is difficult to generate the required spring force to make good electrical contact. Often, oxide layers form over metal structures, such as would be used to form most test points. There must be sufficient contact force to ensure that the oxide layer is either broken up or pierced by the contact element. A second problem is that the micromachined beams are often so small that, if electric charge builds up on the beam, electrostatic force can deflect the beam. If the beam is deflected, it does not make good electrical contact with the integrated circuit chip.

It has been suggested that probe cards be made with micromachined contacts on a flexible membrane, instead of a rigid substrate. Extra stroke and more contact force is provided by the membrane. However, it would be desirable to have a more effective probe card that does not require additional mechanical structure to flex the probe card. Further, using a flexible substrate, while it might be possible in some probing applications, is impractical for other applications in which small, clustered contact elements are required.

Another problem that has come about because of the high levels of integration of semiconductor devices into small packages is thermal stress. Thermal stress occurs when two items, made of materials with different coefficients of thermal expansion, are rigidly attached or when two items—of similar or dissimilar material—experience a large temperature gradient. If an integrated circuit chip, which is generally made of silicon, were soldered directly to the printed circuit board, differences in the coefficient of thermal expansion between the silicon in the chip and the printed circuit board would stress the solder bonds and might cause the bonds to break. The problem is particularly acute for highly integrated parts because such parts can generate a lot of heat in operation and also because a limited amount of solder can be used for attaching the numerous points of the packaged part to the printed circuit board. Even a silicon chip mounted to a ceramic substrate, if the chip dissipates high power, can experience problems with conventional attachment techniques.

To avoid problems associated with thermal stress, BGA packages are generally made by attaching the integrated circuit chip to a small printed circuit board that is separated from the chip by a compliant structure, such as an elastomeric pad. The solder balls are formed on one side of the small printed circuit board. Wire bonds run from the chip to the printed circuit board. Traces in the printed circuit board connect the wire bonds to the solder balls. The entire structure is encapsulated, leaving just the solder balls exposed.

This type of packaging adjusts for thermal stress that might occur when the BGA is mounted to a large printed circuit board. The printed circuit board inside the BGA package has a coefficient of thermal expansion that matches the printed circuit board to which the BGA package is attached, thereby reducing the thermal stress on the solder joints. There is still a mismatch of thermal expansion between the chip and the small circuit board inside the BGA package. However, the wire bonds between the chip and printed circuit board are flexible enough to adjust for forces caused by the mismatch.

While such packages satisfy the requirement for mounting semiconductor chips, they are relatively complicated to manufacture. It would be highly desirable to be able to package integrated circuit chips without the need for a small printed circuit board inside the package.

In addition, small scale packaging is also generally associated with integrated circuits that operate at high frequencies. It would be desirable to have contact elements suitable for testing at very high frequency.

SUMMARY OF THE INVENTION

With the foregoing background in mind, it is an object of the invention to provide a contact structure that can easily be made for use with semiconductor devices.

It is also an object to provide a contact that provides compliance in multiple directions.

It is also an object to provide a contact that provides compliance and a mounting point for a solder ball to thereby allow solder balls of a BGA package to be mounted without the use of an intervening circuit board.

The foregoing and other objects are achieved with a contact having a contact point mounted on a compliant member. The compliant member is bent to provide compliance in multiple directions.

In a preferred embodiment, the number of bends in the compliant member equals or exceeds the number of points at which the compliant member is affixed to a substrate.

In a preferred embodiment, the contact members have a very small scale. They are formed using microelectrical mechanical fabrication techniques and are formed on silicon substrates.

BRIEF DESCRIPTION OF THE DRAWINGS

The invention will be better understood by reference to the following more detailed description and accompanying drawings in which

FIG. 4A shows a contact element according to the invention configured to provide a contact pad;

FIG. 4B shows a contact element according to the invention configured to provide a probe tip;

FIG. 5A shows a contact element according to the invention configured with a contact pad holding a solder ball;

FIG. 5B shows an alternative embodiment of a contact element according to the invention;

FIG. 6 is an isometric view of the bonding pads on the surface of an integrated circuit chip;

FIG. 7 shows an alternative embodiment of a contact element according to the invention which is adapted for making a probe for probing bonding pads as shown in FIG. 6;

FIG. 8A is an isometric view of a probe for probing bonding pads as shown in FIG. 6;

FIG. 8B is an enlarged view of a portion of the probe in FIG. 8A;

FIG. 9 is an alternative implementation of the contact element in FIG. 7; and

FIG. 10 is a sketch illustrating a ball grid array package formed according to the invention.

DESCRIPTION OF THE PREFERRED EMBODIMENT

Copending U.S. patent application by Slocum et al. entitled ROBUST, SMALL ELECTRICAL CONTACTOR, filed simultaneously with this application and hereby incorporated by reference, describes a contact structure which provides reliable and repeatable contact. That contact structure is designed to withstand forces parallel to the substrate which carries an array of contact elements. Because the contact structure is resistant to forces parallel to the substrate, it is not well suited to provide compliance when forces are applied parallel to the substrate.

Figure 1:
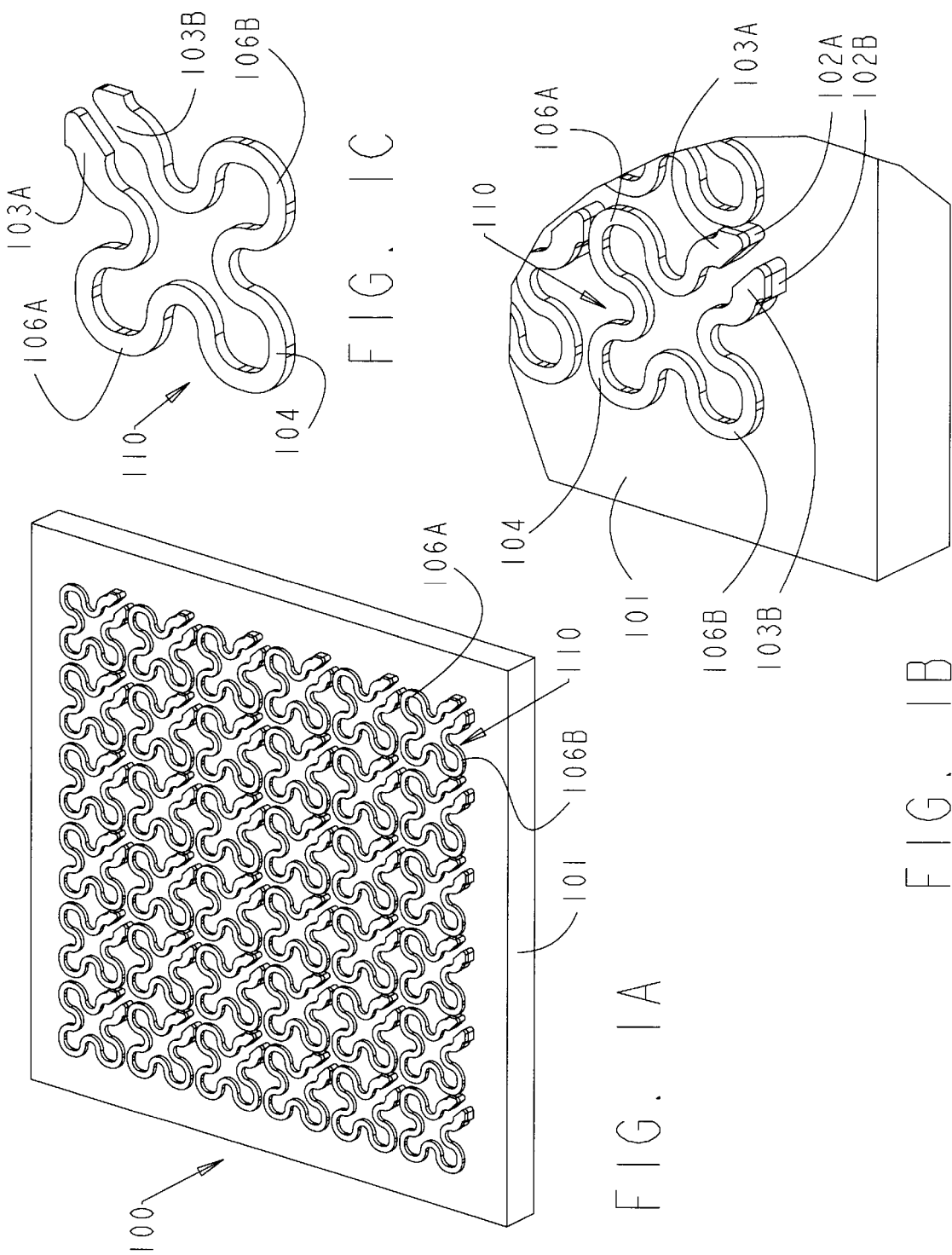
FIG. 1A is an isometric view of an array of contact elements according to the invention.
FIG. 1B is an enlarged view of a portion of FIG. 1A showing greater detail of one contact element.
FIG. 1C shows further detail of the compliant member of a contact element of FIG. 1A.

FIG. 1A shows an array 100 of contact elements 110 fabricated on a substrate 101. Though specific size of the contact elements 110 or the array 100 are not critical to the invention, the invention will be most useful in conjunction with large arrays of relatively small contact elements. Such arrays are needed in many facets of semiconductor fabrication or utilization. It is contemplated that contact elements 110 will be less than 2 mm in any direction. However, the invention will be most useful for making contact to arrays of points that are very close together. For example, ball grid array packages have solder balls that are on a pitch of 1.27 mm and smaller. Thus, in a preferred embodiment contact elements 110 will be 1.3 mm or less in any dimension. Very significantly, the contact elements of the invention are intended to provide the spring force, compliance and robustness for making contact on a very small pitch. Thus, in some embodiments, contact elements 110 will have a maximum dimension of 0.5 mm or less, allowing an array 100 to be constructed with contact elements on a pitch of 0.5 mm.

Various items might be used as a substrate. The choice of substrate material will depend in large measure on the intended use of the array 100 of contact elements. As will be described below, silicon, such as is conventionally used in the fabrication of integrated circuits, and epoxy based material, such as is conventionally used to make printed circuit boards, are two desirable substrate materials.

In a preferred embodiment, substrate 101 will have electrically conducting traces (not shown) running through it. Each contact element 110 is connected to a trace, thereby allowing electrical signals to be routed to and from the contact elements 110.

The contact elements 110 are made of one or more conducting members, generally parallel with substrate 101. The conducting members are made from a springy material with bends in them.

As described in greater detail below, conducting members 110 could be a metal, such as aluminum, nickel or chrome. Alternatively, they could be made from a semiconductor, such as silicon, germanium or gallium arsenide, either doped or undoped. Alternatively, contact elements 110 could be made from a ceramic, such as silicon nitride or silicon carbide, or a silicon oxide. If an insulative material is used as the springy material, a conductive material will be overlayed on the insulative material. For example, a highly conductive material without adequate springiness, such as gold, might be deposited over a silicon nitride beam.

The bends give the contact elements 110 compliance in multiple directions. As shown in FIG. 1C, the bends give contact element 110 four approximately equal lobes. The lobes give contact element 110 a clover-shape. Contact element 110 is bent into two arm portions 106A and 106B and a tip portion 104 (FIG. 1B). Arm portions 106A and 106B give contact element 110 bending and torsional compliance when subjected to forces at tip portion 104.

As a result clover-shaped contact element 110 as shown in FIG. 1A has compliance with three degrees of freedom. Tip portion 104 can move in a direction perpendicular to the surface of substrate 101. It can also move in the two directions that define a plane parallel with the surface of substrate 101.

Additionally, the clover-shaped structure combines bending and torsional stress in a small area, thereby maximizing the compliance potential of the material. This shape allows the contacts to be miniaturized, while still providing the required contact force and compliance.

In a preferred embodiment, conducting element 110 has a thickness of approximately 0.01 mm to 0.05 mm. The overall length of conducting element is approximately 0.15 mm to 1 mm. The bend radius of each of the lobes is 0.01 mm to 0.1 mm.

As seen in greater detail in FIG. 1B, contact element 110 is mounted above the surface of substrate 101. Contact elements 110 are mounted to posts 102A and 102B, that hold contact element 110 above substrate 101. Posts 102A and 102B project, in the illustrated embodiment, above the surface of substrate 101 by about 0.1 mm. This dimension defines the stroke of the connector and will thus be set to equal or exceed the desired amount of deflection at the tip 104.

As shown in FIG. 1B, contact element 110 has two ends 103A and 103B that are mounted to separate posts 102A and 102B. This configuration is desirable for making a probe for "fly-by" testing, as will be described below. Briefly, fly-by testing occurs when a signal is applied to a test point over a separate path than is used to measure signals at the same point. "Fly-by" testing is used with high speed signals in which transmission line effects might cause interference between signals being applied to and measured at a test point. Where "fly-by" type contact is not required, a single post might be used.

Preferably, posts 102A and 102B are electrically conducting. Posts 102A and 102B connect contact element 110 to the conductive traces within substrate 101. If posts 102A and 102B are made of a non-conducting material, conducting pathways can be included through them, such as vias used in circuit board or semiconductor fabrication, to make electrical connection between contact element 110 and the traces within substrate 101.

Figure 2:
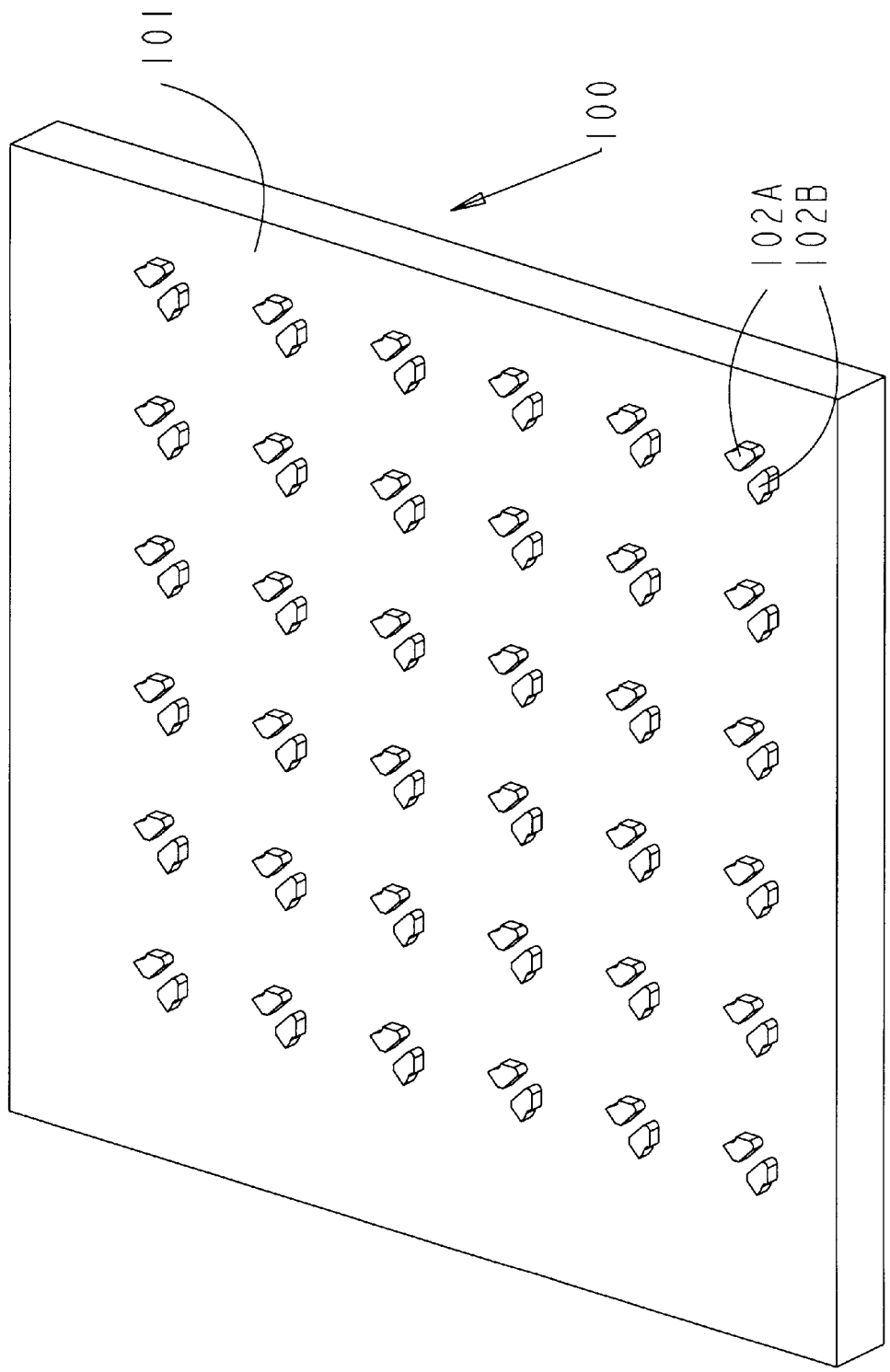
FIG. 2 shows a step in the fabrication of the array of contact elements of FIG. 1A.

FIG. 1C shows contact element 110 in greater detail. FIG. 2 shows the posts 102A and 102B on substrate 101 without showing contact element 110. In the embodiment of FIG. 2, posts 102A and 102 are electrically conducting and are physically separate. In the embodiment of FIG. 2, the surface of substrate 101 is an insulator, which may overlay a ground plane within substrate 101. If contact element 110 is formed from an insulator with a conductive trace on one surface, then the surface of substrate 101 can be a conductive ground plane.

Figure 3:
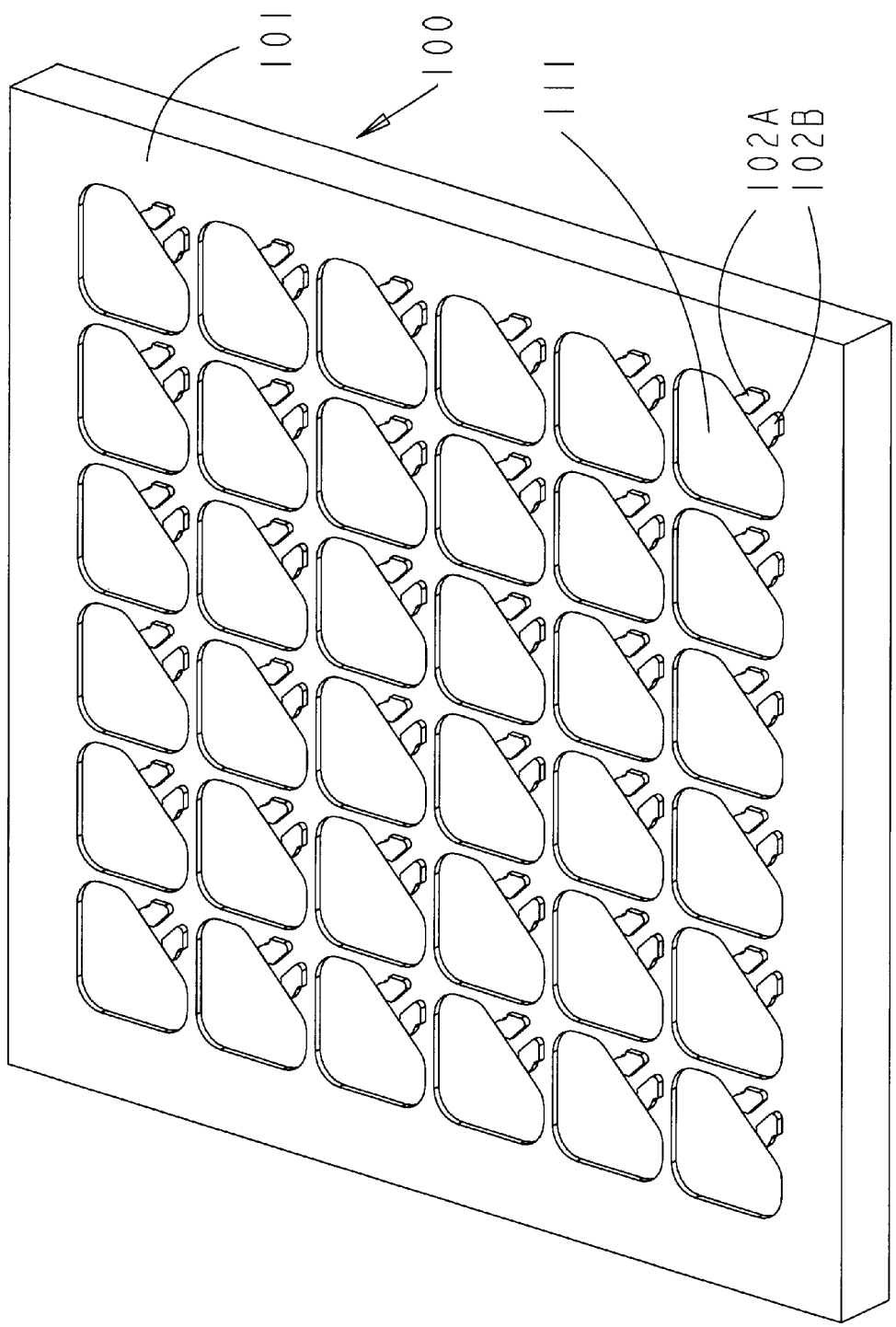
FIG. 3 shows a step in the fabrication of an alternative embodiment of the array of contact elements made according to the invention.

FIG. 3 shows an alternative implementation of substrate 101, which forms a base for mounting array 100. In FIG. 3, substrate 101 is formed with a well 111 associated with each contact element 110. As described above, tips 104 of contact elements 110 bend toward substrate 101 when making electrical contact with another structure, such as an integrated circuit chip or printed circuit board. In the embodiment of FIG. 1A, posts 102A and 102B have a height sufficient to provide the required contact stroke. In the embodiment of FIG. 3, posts 102A and 102B do not need to be so high. When a contact element 110 is making electrical contact, tip 104 will bend into recess 111, thereby providing the required stroke. The embodiment of FIG. 3 is useful for manufacturing processes in which it is easier to form a recess than to construct a tall post.

FIG. 4A and 4B illustrate important advantages of a contact element according to the invention. A contact element 402 is shown with the same "clover-leaf" structure of contact element 110. However, base 401 of contact element 402 is solid instead of split as shown in FIG. 1A. Additionally, a post 403 has been fabricated at the tip of contact element 402. Post 403 might, for example, be etched or otherwise fabricated with a point to facilitate good electrical connection with a metal surface on which an oxide layer has formed. Post 403 aids in breaking the oxide layer such that good electrical contact is made to the underlying metal conductor.

The embodiment of FIG. 4B can also be used as the basis form making a compliant pad structure 400. In the embodiment of FIG. 4A, post 403 serves as an attachment point for a pad 410. While the embodiment of FIG. 4B is suited for using the array of contact elements as a probe to make electrical contact to numerous points on an integrated circuit chip, the embodiment of FIG. 4A is useful for making compliant pads on an integrated circuit chip. Pads are often included on the exterior surfaces of packaged integrated circuit chips, particularly BGA type packages. The pads serve as an attachment point of the chip to a printed circuit board or other substrate, such as might be found in a multichip module (MCM). An important advantage of making compliant pads on an integrated circuit chip is that problems associated with thermal stress are greatly reduced.

In FIG. 4A, pad 410 is attached at one end to post 403. Post 403 lifts pad 410 above contact element 402, such that contact element 402 will still provide compliance both parallel and perpendicular to substrate (such as 101 in FIG. 1A) to which the array is mounted.

Pad 410 may optionally be formed with a ring 411. Ring 411 serves to retain a solder ball on pad 410, thereby aiding in miniaturization of the BGA technology. In making BGA type devices, a solder ball is placed on a pad.

FIGS. 5A and 5B show an alternative embodiment of a contact element 500. Contact element 500 has two spiral shaped beams 502A and 502B. One end of each beam 502A and 502B is attached to post 501A or 501B, respectively. Posts 501A and 501B elevate beans 502A and 502B above the surface of a substrate (such as substrate 101 in FIG. 1A). The other end of each beam is attached to tip 503. Tip 503 is thicker than beams 502A and 502B such that the upper surface of tip 503 is above the beams 502A and 502B. In the case of a probe card, tip 503 can be shaped into a point appropriate for piercing an oxide layer on a pad it contacts.

Beams 502A and 503B can deflect down towards a substrate. Alternatively, they can flex at their bends to allow compliance of tip 503 in a plane parallel to the surface of a substrate (such as substrate 101 in FIG. 1A).

Contact clement 500, in the configuration of FIG. 5B, could be used to probe pads, such as might be found on an integrated circuit chip. For probing, tip 503 might be etched to be pointed. A pointed tip improves electrical contact by piercing an oxide layer which might build up on a metal pad to which contact element 500 us to make electrical contact.

Alternatively, a larger pad 510 might be attached to tip 503. Pad 510 is elevated above beams 502A and 502B, thereby allowing tip 503 to have its full range of compliant motions. Pad 510, because it is attached to tip 503 also has a full range of compliant motion perpendicular and in a plane parallel to a substrate (such as 101 in FIG. 1A). Pad 510 might thus be used as an attachment point for a solder ball in a BGA package that is resistant to thermal stress. Pad 510 has an optional ring 511 around its periphery to act as a lip to help restrain solder ball 551.

FIG. 10 illustrates a semiconductor device with a ball grid array package according to the invention. FIG. 10 is drawn with a scale that exaggerates the contact elements. In FIG. 10, a substrate 101 is shown in cross section. In this embodiment, the substrate 101 contains the electronic circuitry of the semiconductor chip. On one surface of the chip, an array of contact elements is formed. In FIG. 10, five such contact elements are shown in a row. In a practical application, there would likely be many more such contact elements, but only five are shown for clarity.

Each contact element 402 is mounted on a post 401 to a surface of the chip that acts as substrate 101. Pads 410 are elevated above contact elements 402 on posts 403. Ring 411 retains a solder ball 551. The entire chip is encased in a housing 1010, which is optional.

In use, the solder balls 551 would be placed against a printed circuit board and heated until they reflow, thereby securing pads 510 to the printed circuit board. Contact element 500 would then provide compliance between the chip and the printed circuit board, making the structure immune to thermal stress.

Other shaped contact elements might be preferable for other configurations. FIG. 6 shows the surface of an integrated circuit chip 600. Integrated circuit chip 600 has numerous pads 601 on it. Pads 601 are laid out in rows along the periphery of chip 600 in what is commonly referred to as a peripheral pad layout. Pads 601 connect to circuit elements within chip 600. When packaging chip 600, wire bonds are made from pads 601 to contact points extending from the package.

Having pads 601 near the periphery of chip 600 is important to allow wire bonding. However, placing all the pads along the periphery means that the spacing between each pad will be very small. It is typical for the pads to be 0.004 inches (0.1 mm) square and spaced on center on the order of 0.006 inches (0.15 mm) or less. Making the contact elements as in FIGs. 1A or 5B with such a spacing might be undesirable. However, current probe cards are largely made using long tungsten needles for contact element, which is also undesirable.

To reduce costs, it is also desirable to test as many dies on a wafer as possible. Thus, a probe card that makes contact to the pads 601 would, in general, contain contact elements to contact the pads on many dies simultaneously. In a traditional probe card the beams that form the contact elements are so long, with the contact pads around the periphery of each chip, it is difficult to fit the contact elements for adjacent chips. Even using micromachining techniques to make very small beams, fitting beam-type contact elements for the pads 601 in the corners of chip 600 present a particular difficulty.

To avoid these difficulties, many probe cards contain contact elements that align with the pads on dies that are spaced apart on the wafer. Thus, only dies that are physically separated on the wafer can be tested simultaneously. Testing in this fashion, though, requires more complicated set-up to ensure that all dies are eventually tested. Testing in this fashion also reduces efficiency because it will not always be possible to match the pattern of contact elements on the probe card to untested dies on the wafers.

Thus, there would be an advantage to making a probe card that contained several arrays of contact elements. Each array of contact elements should have the probe tips of the contact elements aligned in rows to match the pattern of pads 601. In addition, the contact elements should be confined within an area that matches the area of a chip 600. In this way, a probe card could be made that contacts adjacent dies on a wafer simultaneously.

FIG. 7 shows a contact element 700 that could be used to make a probe card with an array of contact elements having their tips arranged in lines along the periphery of the chip. However, all of the contact elements in the array can be positioned within the boundaries of the chip. Such a probe card would be useful for simultaneously probing several adjacent dies on a wafer.

FIG. 7 shows an L-shaped contact element 700. The L-shaped contact element 700 has a first arm portion 705 and a second arm portion 706. The arms 705 and 706 are elevated above the surface of a substrate (such as 101 in FIG. 1A) by post 701.

In use, first arm portion 705 is loaded in bending and torsion when a force normal to the surface of probe card 802 is applied at tip 703. Second arm portion 706 is loaded in bending. By configuring first arm 705 such that it is loaded in both bending and torsion, the strain carrying capacity of the material is increased. Thus, the L-shaped contact provides greater strain carrying capacity than a straight beam having the same length, thereby allowing a contact meeting the mechanical requirements for a probe card to be fit into a smaller area.

Arms 705 and 706 are shown made of an insulating material with a conductive trace 704 deposited thereon. Arms 705 and 706 are, in a preferred embodiment formed of undoped silicon. Undoped silicon has high strength and is therefore unlikely to be permanently deformed or damaged when used.

Undoped silicon is an insulative material. To provide the required conductivity, metal trace 704 is formed over arms 705 and 706. Metal trace 704 is connected to traces on a substrate (such as 101 in FIG. 1A) through a via through post 701 at point 702, which is not visible in FIG. 7 because it is below trace 704. In some applications, it will be desirable to provide a dielectric coating over arms 705 and 706 before metal trace 704 is deposited. For example, arms 705 and 706 might be coated with silicon nitride that allows contact 700 to be a shielded impedance controlled design.

To improve contact with pads, such as pads 601 (FIG. 6), a probe tip 703 can be formed on second arm 706. In a preferred embodiment, probe tip 703 is made of a hard metal, such as chrome, that is etched into a point. Probe tip 703 breaks through any oxide layer that might form on a pad 601.

The L-shaped contact elements 700 are particularly well suited for making arrays of contact elements on a probe card. FIG. 8A shows one array 800 of contact elements 700 that might be incorporated into a probe card. FIG. 8A shows one array of contact elements that is intended to probe one die on a wafer, such as die 600 (FIG. 6). It will be appreciated that multiple arrays of contact elements will be incorporated into a probe card 802. For simplicity, only one such array is shown. However, it will be appreciated that the array of FIG. 8A would be repeated multiple times on probe card 802. The arrays would be spaced to match the spacing of dies on the wafer to be probed.

FIG. 8B shows an enlarged view of one corner of the array 800. The probe tips 703 are positioned in rows that match the rows of contact pads 601 (FIG. 6) being probed. Note also that the unique L-shape of contact elements 700 allows contact elements to be aligned with all contact pads—even at the corners of the die. Contact elements 700 are disposed in two rows. Inner row 803 has contact elements with second arm 706 bending to the left. Outer row 804 has contact elements with second arm 706 bending to the right. The contact elements in inner row 803 and outer row 804 are interleaved to enable the contact elements 700 to nest. A probe tip 703 in inner row 803 aligns with every second contact pad around the periphery of chip 600. Likewise, the probe tips 703 in outer row 804 align with every second contact pad, and are interleaved with the probe tips from inner row 803. This interleaved pattern continues even at the corner of the pattern of peripheral pads, thereby reducing the overall area occupied by the contact elements. In this way, all of the contact elements 700 for one chip 600 can fit within the area occupied by that die on the wafer. Thus, multiple adjacent die can be readily probed.

FIG. 8B also shows a stop 801 positioned below each probe tip 703. Stop 801 is optional. However, it is desirable because it allows contact element 700 to be elevated further above the surface of probe card 802 than the required stroke of probe tip 703. This additional clearance allows the probe card to continue operation even if some oxide, such as might be scraped off a contact pad, or other contaminant gets on the surface of probe card 802. Stop 801 prevents contact element 700 from being over stressed and therefor damaged. A stop 801 might be used, for example, where it is desired to increase the spacing between a contact element 700 and substrate 802. Increasing the clearance makes it less likely that oxide scraped from chips being probed or other contaminants will interfere with the operation of a probe card. Stop 801 can be an insulative material such as silicon oxide. However, a conductive material could also be used, depending on the circuitry of the probe card.

FIG. 9 shows an alternative implementation of contact element 700. Contact element 900 is likewise L-shaped with a first arm 905 and a second arm 906. The arms 905 and 906 might be made of silicon in the same way that arms 705 and 706 are described. However, in the embodiment of FIG. 7, the conductive trace 704 is deposited on the surface of the arms 705 and 706.

In the embodiment of FIG. 9, the conducting element is a layer in a trench 904 that is formed in the surface of arms 905 and 906. Contact is made to the conductive trace in trench 904 by means of a via through post 901. At the tip end of contact element 900, a conductive pad 907 is deposited. Conductive pad 907 makes electrical contact with the conducting element within trench 904. A probe tip 903 may then be formed on pad 907.

An advantage of forming a conductive layer in a trench is that the stress on the conducting element might thereby be reduced. Reducing the stress on the conducting element will be particularly important if the conducting element can withstand less stress than the arms. It is also important because the conducting element, if deposited on the surface of the arms, might experience more stress than the arms.

Ideally, trench 904 is cut to a depth in arms 905 and 906 such that the bottom of the trench falls on the "neutral axis" of the beam. When a beam bends or twists, one side of the beam will be stretched. The other side will be compressed. At some point in the beam, the beam is neither compressed nor stretched. The points that are neither stretched nor compressed define the neutral axis. The neutral axis will usually fall near the center of the beam. Preferably, trench 904 will have a depth that is between one quarter and three quarters of the thickness of the arms. In this manner, the stresses on a metal conductive trace, which can not readily withstand the same stresses as silicon, will be minimized.

It might be necessary to limit the depth of trench 904 to avoid weakening the arms 905 and 906. In a preferred embodiment, trench 904 will have a depth that is between about one quarter and one half the thickness of the arms.

FABRICATION

It is contemplated that the contact elements described above will be fabricated using microelectromechanical fabrication techniques. To make an array of contact elements such as 100, fabrication would start with a silicon substrate. Preferably, circuit traces will first be formed in the silicon substrate in the same way that circuit traces are formed within a silicon substrate when manufacturing an integrated circuit chip.

The circuit traces carry signals to and from each contact element. In a preferred embodiment, there will be a separate circuit trace for each of the posts 102A and 102B (FIG. 1A). One trace will be used to carry signals to the contact element and the other will be used to carry the signals away from the contact elements.

Vias will then be cut through the surface of substrate 101, allowing electrical contact to be made to the circuit traces.

Posts 102A and 102B are then formed over those vias. The posts are formed by depositing a layer of material over the surface of the substrate and then selectively etching it away to leave the pattern as shown in FIG. 2. If that material is a conductor, such as doped silicon, electrical connection is thereby made to the traces inside the substrate 101.

However, if posts 102A and 102B are made from an insulative material, such as undoped silicon, silicon oxide or silicon nitride, vias will have to be cut through the posts and a conductive material, such as aluminum, deposited in the vias. Conductive material can be deposited in the vias in the same way that vias are formed in the manufacture of semiconductor circuits.

Next, a sacrificial layer is deposited over the surface of the substrate 101. The sacrificial layer is formed to a thickness equal to the height of posts 102A and 102B.

Another layer of material is then deposited over the sacrificial layer. This layer is the material that forms contact element 110. That layer is patterned to the required shape of contact element 110. If the material is an insulator, vias are cut through the layers above posts 102A and 102B, so that electrical contact is made between the contct element 110 and the traces within substrate 101.

Once contact element 110 is shaped in the upper layer, the sacrificial layer is removed, such as by etching. In etching the sacrificial layer, etchant that preferentially removes the sacrificial layer but leaves the other structures largely unaffected is used.

If the embodiment of FIG. 3 is used, the wells 111 are etched in the surface of substrate 101 before posts 102A and 102B are formed.

If the embodiment of FIG. 4A or 4B is to be used, another layer, such as a metal layer is deposited over the structure and then patterned to leave posts 403. Preferably, this step is performed before the sacrificial layer is removed.

If the embodiment of FIG. 4A is desired, another sacrificial layer is deposited. The second sacrificial layer has a thickness equal to the height of post 403. A metal layer is then deposited and etched to form pad 410. Another layer can be deposited and patterned to form ring 411, if desired. The layer of material used to form ring 411 might be metal or could, alternatively, be an insulator or other material.

The fabrication steps for the other embodiments are similar. Layers are deposited and then patterned to give structures of the required shape.

OPERATION

Array 100 is designed for use in making a contactor for testing ball grid array parts. Each of the contact elements 110 is positioned to align with a ball on the ball grid array. In particular, tip 104 is positioned to align with the solder ball. Note that tip 104 is formed by an open loop. One possible mode of using contact element 110 is to align the open loop of tip 104 with the solder ball such that the solder ball fits partially into the open loop. If, in the fabrication of array 100, probe tip 104 does not perfectly align with a solder ball, the loop at tip 104 will tend to reach a stable point surrounding the tip of the solder ball. The compliance of contact element, particularly in a plane parallel to substrate 101, makes it possible for tip 104 to move into the required position.

To perform a test, array 100 is connected to an automatic test system in the place of a convention contactor. Electrical stimulus signals are produced by the test system and passed through the traces in substrate 101 to post 102A. The signals pass through post 102A to contact element 110. The stimulus signal passes through arm 106A to tip 104.

Response signals travel back from tip 104 through arm 106B. The response signals pass through post 102B into traces in substrate 100. Those traces run to comparator circuits inside the test system.

In this way, stimulus and response signals run through separate paths. This configuration results in what is called "fly-by" testing. Fly-by testing is particularly beneficial for high frequency signals. By way of example, high frequency signals are digital signals having data rates in excess of 750 MHz. Fly-by testing will be most useful in conjunction with signals having data rates above 1 GHz.

The configurations of FIG. 4A and FIG. 5A represent points on a ball grid array package to which solder balls are attached. In operation, the ball grid array package is tested by pressing it against a contactor, which can simply be a series of pads. Contact elements 400 or 500 provide the required compliance and spring force to make good electrical contact to the device.

If the BGA device tests OK, it can then be placed on a printed circuit board or the substrate of a multichip module. The solder balls are then heated to reflow the solder, thereby soldering the pad 410 or 510 to the printed circuit board, substrate of the multichip module or other chip interconnect system.

When the BGA chip is made with solder balls attached using contact elements such as 400 or 500, the contactor and the printed circuit board to which the BGA will ultimately be attached are very similar. Each is simply a series of pads that align with the solder balls. In this case, the printed circuit board might even be used as the contactor for test. For example, the BGA part might be pressed against the printed circuit board. The printed circuit board would then be connected to the automatic test system. The test system would then generate and measure test signals to the part through the board. If the test passed, the part might be then soldered to the board. Such a manufacturing operation might be particularly useful for attaching chips to multi-chip modules.

FIGS. 8A and 9 illustrate contact elements that are suitable for making a probe card. The probe card would be made with multiple arrays on it, each matching the pattern of test pads of one chip on the die. The probe card would be attached to a test system, as with a conventional probe card.

A wafer would then be aligned with the probe card using a device known in the industry as a "prober." The prober would align the wafer so that a set of adjacent chips on the wafer were each aligned with one array of contact elements on the probe card.

The test system would then generate stimulus signals and measure response signals to test multiple chips on a wafer. These test signals would be passed through traces on the probe card to the contact elements on the probe card. The test system would then test the chips as with a conventional probe card. However, the chips tested could be adjacent on the wafer.

Once one set of chips is tested on the wafer, the prober would move the wafer to align a new set of chips with the arrays of contact elements on the probe card. This process would be repeated until all the chips on the wafer were tested. Because a probe card made according to the invention can probe adjacent chips simultaneously, the test operation can be performed more efficiently than when a convention needle-epoxy probe card is used.

Thus, it can be seen that contact elements according to the invention provide significant advantages over existing technology.

EXAMPLE

An L-shaped contact element such as 700 (FIG. 7) might be formed with the following dimensions: First arm 705 has a length of 0.010 inches (0.245 mm). Second arm has a length of 0.009 inches (0.221 mm). The width of each arm is 0.002 inches (0.049 mm) and the thickness about 0.0005 inches (0.012 mm). When made in silicon with a modulus of elasticity of about 200 GPa, a force of about 0.005 pounds (2 grams) should cause tip 703 to deflect about 0.003" (0.074 mm) and there would be Von-Mises stress in the beam of about 500 ksi. This large (in comparison to the scale of the devices being built) degree of deflection is made possible by the combined bending and torsion of the L-shaped beam.

In contrast, a simple cantilevered beam with the same foot print would have a free cantilevered length of 0.009 inches (0.221 mm). To cause a 0.009 inch (0.221 mm) long, 0.0005 inch (0.012 mm) thick cantilevered beam to deflect the same distance would create a stress in the beam of 800 ksi, which is above the elastic limits of silicon. If the same beam were made of Beryllium Copper alloy, the stress would be 450 ksi, which is well above the elastic limit of 150 ksi.

Thus, for a given available space, the L shaped beam should provide a significantly greater stroke with the desired force to break oxides than a straight cantilevered beam.

ALTERNATIVE EMBODIMENTS

Having described numerous embodiments, other alternative embodiments or variations might be made. For example, it is described that the substrate has an upper surface and directions are recited relative to this surface. It will be appreciated that the designation "upper" is intended only to provide relative orientation and is not intended to imply an absolute direction relative to gravity. Integrated circuit chips can be probed from any direction. Likewise, chips can be mounted to a printed circuit board with the surface described as the upper surface facing towards or away from the printed circuit board.

Also, it was described that silicon based material are used as a substrate and also to form the contact elements. It will be understood that silicon is a preferred material because of its widespread use in the fabricating semiconductor integrated, circuits. Other semiconductor materials, such as germanium or gallium arsenide, might alternatively be used. Further, while semiconductor materials are preferred because they allow integration of active circuitry with the contact elements, the invention might be employed without using semiconductor elements. For example, it might be possible to manufacture the contact elements on saphire, ceramic, epoxy or other materials suitable for use as a substrate for electrical circuits.

In addition, all of the substrate materials used in the preferred embodiments are rigid material. However, it is possible that structures as disclosed could be used on flexible substrate, such as are typically used in a membrane probe card.

FIG. 9 describes that a trench 904 is formed in arms 905 and 906 to relieve stress on the conducting element. The conducting element might be formed in a serpentine shape, also to relieve stress. Such a shape is disclosed in copending patent application 08/832,303 entitled FLEXIBLE SHIELDED LAMINATE BEAM FOR ELECTRICAL CONTACTS AND THE LIKE AND METHOD OF CONTACT OPERATION by Slocum et al., which is hereby incorporated by reference.

Also, it should be appreciated that the manufacturing techniques described herein are not exclusive. For example, it was described that posts 102A and 102B are formed in a separate step than contact elements 110. If the posts and contact elements are formed of the same material, they might be formed in the same step. One layer having a thickness equal to the height of the post plus the thickness of the contact element might be deposited. The contact element and posts might be shaped in one etching operation by etching free space below the contact element.

Also, while manufacturing using microelectromechanical fabrication techniques is a preferred embodiment, other fabrication techniques might be employed. For example, the contact elements might be formed in a metal sheet which has been deposited on a sheet of insulative material, such as Kapton (a trademark of Dupont). The contact elements might be formed by stamping or etching. The metal contacts can then be soldered, brazed or welded to metal posts on the substrate. The insulative material would then be burned away with a laser or otherwise removed.

As another embodiment, it was described that a Ball Grid Array package was made using compliant pads on the package as a mounting point for solder balls. It is not necessary that the package be manufactured with the solder balls on the package before it is attached to the printed circuit board. The solder balls, or even solder paste, might be applied first to the printed circuit board. Pads 410 on the BGA package would then be attached to the solder on the board. The same finished circuit board with the BGA attached would result.

Further, it was shown that contact elements are formed with conductive traces on an upper surface. The contact elements might be formed on the lower surface of the contact elements. Additionally, conductive traces might be formed on stops 801 or on the surface of substrate 101. Conduction between the trace on the lower surface of the contact element and the upper surface of stops 801 or substrate 101 would indicate that the beam had been deflected to the full extent of its travel. Such a signal might be used for an overtravel signal. It might also be used as a planarizer signal, indicating which test points are out of line with the others.

Also, it should be noted that the term "solder" is used throughout. That term could refer to a low melting point metal alloy. However, it could more generally refer to a material that can be used for mechanical and electrical connection of electronic components. For example, conductive polymers are sometimes used in place of more traditional metal alloy solders.

Therefore, the invention should be limited only by the spirit and scope of the appended claims.

What is claimed is:

1. An array of contact elements fabricated with a spacing of 2 mm or less between adjacent contact elements, comprising:
   a) a substrate having an upper surface;
   b) a plurality of posts extending perpendicular to the upper surface of the substrate; and
   c) a plurality of contact elements, each fixedly attached to at least one post, and each having an electrically conducting tip portion spaced from the post to which it is attached, the contact element having at least three looped portions formed therein, the first looped portion disposed between the tip portion and the post, the second looped portion being coincident with the tip portion and the third looped portion disposed between the second looped portion and the post.

2. The array of contact elements of claim 1 wherein each contact element has a clover leaf shape.

3. A packaged integrated circuit chip incorporating the array of contact elements of claim 1, the integrated circuit chip package additionally comprising:
   a) a plurality of pads, each connected to a tip portion of a contact element;
   b) a plurality of solder balls, each disposed on one of the plurality of pads.

4. The integrated circuit chip of claim 3 wherein the substrate comprises the integrated circuit chip.

5. The packaged integrated circuit chip of claim 3 wherein each of the plurality of contact elements is parallel with the surface of the substrate and the pad is parallel to and above the contact elements.

6. The packaged integrated circuit chip of claim 3 wherein each of the plurality of contact elements is formed from a conducting member having a plurality of bends formed therein.

7. The packaged integrated circuit chip of claim 6 wherein the plurality of bends are parallel to the surface of the substrate.

8. The packaged integrated circuit chip of claim 7 wherein the plurality of bends in the contact element form a clover leaf shape.

9. The packaged integrated circuit chip of claim 7 wherein the plurality of bends in the contact element form a spiral shape.

10. A printed circuit board having a plurality of conductive pads incorporating the packaged integrated circuit chip of claim 3 wherein each solder ball is disposed on and fixedly attached to one of the pads of the packaged integrated circuit chips and one of the pads of the printed circuit board.

11. An array of contact elements fabricated with a spacing of 2 mm or less between adjacent contact elements, comprising:
    a) a substrate having an upper surface;
    b) a plurality of posts extending perpendicular to the upper surface of the substrate; and
    c) a plurality of contact elements, each fixedly attached to at least one post, and each having an electrically conducting tip portion spaced from the post to which it is attached, each contact element having a first arm and a second arm attached at a right angle to the first arm with the tip portion the contact element disposed in at least two parallel rows, with the tip portions of contact elements in each row falling along a line.

12. The array of contact elements of claim 11 wherein the substrate comprises a semiconductor.

13. An array of contact elements, comprising:
    a) a substrate having an upper surface;
    b) a plurality of posts extending perpendicular to the upper surface of the substrate; and
    c) a plurality of contact elements, each fixedly attached to at least one post, and each having an electrically conducting tip portion spaced from the post to which it is attached, each contact element having:
       i) at least one insulative beam having a long axis, with a trench formed in an upper surface of the beam;
       ii) a metal trace disposed in the trench.

14. The array of claim 13 wherein the insulative beam comprises undoped silicon.

15. A packaged integrated circuit chip comprising:
    a) a semiconductor substrate having electrical circuit elements formed therein;
    b) a plurality of conducting pads;
    c) a plurality of solder balls, each affixed to a conducting pad; and
    d) a plurality of electrically conducting, compliant members electrically and mechanically connecting the pads to the semiconductor substrate, each compliant member having at least three looped portions formed therein.

* * * * *